(12) United States Patent
Suzuki

(10) Patent No.: US 6,379,996 B1
(45) Date of Patent: Apr. 30, 2002

(54) PACKAGE FOR SEMICONDUCTOR CHIP HAVING THIN RECESS PORTION AND THICK PLANE PORTION

(75) Inventor: Katsunobu Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/291,322

(22) Filed: Apr. 15, 1999

(30) Foreign Application Priority Data

Apr. 17, 1998 (JP) .......................................... 10-107643

(51) Int. Cl.[7] .......................... H01L 21/44; H01L 21/48; H01L 21/50; H01L 21/302; H01L 21/461
(52) U.S. Cl. ...................... 438/106; 438/121; 438/122; 438/124; 438/690
(58) Field of Search ................................ 438/106, 121, 438/122, 124, 690

(56) References Cited

U.S. PATENT DOCUMENTS 5,847,458 A * 12/1998 Nakamura et al.
5,877,551 A * 3/1999 Tostado et al.

FOREIGN PATENT DOCUMENTS

| JP | 56-101652 | 8/1981 |
|---|---|---|
| JP | 4-103150 | 4/1992 |
| JP | 9-22962 | 1/1997 |
| JP | 9-27563 | 1/1997 |
| JP | 9-102559 | 4/1997 |
| JP | 9-507344 | 7/1997 |
| JP | 9-213831 | 8/1997 |
| JP | 9-511873 | 11/1997 |
| JP | 10-340973 | 12/1998 |

OTHER PUBLICATIONS

Ashtok Domadia et al., "TBGA Bond Process for Ground and Power, Plane Connections", IEEE 1996 Electronic Component and Technology Conference, pp. 707–712.

* cited by examiner

Primary Examiner—John F. Niebling
Assistant Examiner—Josetta I. Jones
(74) Attorney, Agent, or Firm—McGinn & Gibb, PLLC

(57) ABSTRACT

In a package for mounting including a metal plate having a recess portion for mounting a semiconductor chip and a plane portion for mounting a metal pattern layer, the recess portion is thinner than the plane portion.

15 Claims, 10 Drawing Sheets

PACKAGE FOR SEMICONDUCTOR CHIP HAVING THIN RECESS PORTION AND THICK PLANE PORTION

BACKGROUND OF THE INVENTION

1. Field of the Invention

The present invention relates to a package for a semiconductor chip, and more particularly, to a package having a recess portion for mounting a semiconductor chip and a plane portion for mounting a metal pattern layer.

2. Description of the Related Art

A prior art package includes a heat spreader (metal plate) having a recess portion for mounting a semiconductor chip and a plane portion for mounting a metal pattern layer. The metal plate has a uniform thickness, and a recess having a predetermined depth is formed in the metal plate by a pressing process using metal molds (see Ashtok Domadia et al., TBGA Bond Process for Ground and Power Plane Connections", IEEE 1996 Electronic Components and Technology Conference, pp. 707–712). This will be explained later in detail.

In the above-described prior art package, since the recess is formed in the metal plate by a pressing process, it is impossible to remarkably increase the thickness of the metal plate. Even in this case, the thickness of the metal plate is increased by a moderate value to increase the rigidity of the plane portion thereof. This is advantageous in terms of the handling of the package and forming solder balls. Simultaneously, the rigidity of the metal plate around the recess is increased. Therefore, strain generated in the metal plate around the semiconductor chip due to the heating thereof is hardly leaked through the metal plate around the recess thereof, so that large stress is applied to the back surface of the semiconductor chip. Thus, the semiconductor chip is easily peeled from the metal plate, which deteriorates the reliability of the package.

SUMMARY OF THE INVENTION

It is an object of the present invention to provide a package for a semiconductor chip capable of decreasing the manufacturing cost.

Another object is to improve the reliability of a package for a semiconductor chip.

According to the present invention, in a package for mounting including a metal plate having a recess portion for mounting a semiconductor chip and a plane portion for mounting a metal pattern layer, the recess portion is thinner than the plane portion.

Also, in a method for manufacturing a package including a metal plate including a recess portion for mounting a semiconductor chip and a plane portion for mounting a metal pattern layer, a photoresist pattern layer is formed to cover the plane portion of the metal plate, and the metal plate is etched by using the photoresist pattern layer as a mask.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art package with be explained with reference to FIG. 1 (see: Ashtok Domadia et al., "TBGA Bond Process for Ground and Power Plane Connections", IEEE 1996 Electronic Components and Technology Conference, pp. 707–712).

Figure 1:
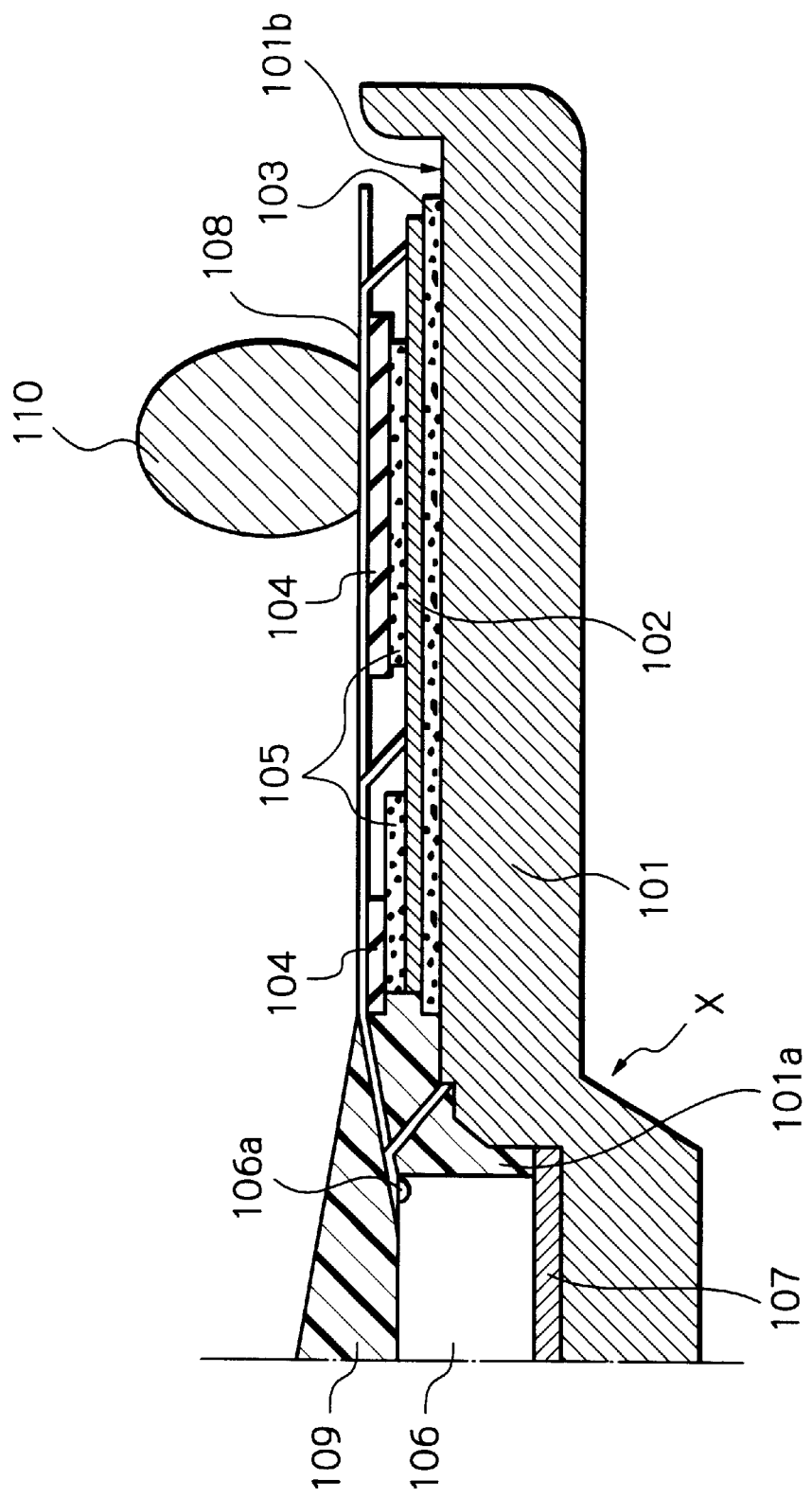
FIG. 1 is a cross-sectional view illustrating a prior art package.

In FIG. 1, which illustrates a prior art one-connection-layer type ball grid array (BGA) type package, a heat spreader 101 made of metal has a uniform thickness, and a recess 101a having a predetermined depth is formed in the heat spreader 101 by a pressing process using metal molds. Note that the heat spreader 101 also serves as a ground plane layer.

A power supply plane layer 102 is adhered by an adhesive layer 103 on a plane portion 101b of the heat spreader 101. Also, an organic insulating pattern layer 104 is adhered by an adhesive layer 105 on the power supply plane layer 102.

On the other hand, a semiconductor chip 106 is mounted in the recess 101a of the heat spreader 101 by a mount material layer 107 made of Ag paste.

Electrodes 106a of the semiconductor chip 106, the heat spreader 101, the power supply plane layer 102 and the like are electrically connected by copper foil connection lines 108 using a tape automated bonding (TAB) process.

The semiconductor chip 106 is sealed by a thermosetting resin layer 109.

Solder balls 110 as external electrodes are formed on the copper foil connection lines 108.

In the package of FIG. 1, since the recess 101a is formed in the heat spreader 101 by a pressing process, it is impossible to remarkably increase the thickness of the heat spreader 101. Even in this case, the thickness of the heat spreader 101 is increased by a moderate value to increase the rigidity of the plane portion 101b of the heat spreader 101. This is advantageous in terms of the handling of the package and forming the solder balls 110. Simultaneously, the rigidity of the heat spreader 101 around the recess 101a thereof as indicated by X in FIG. 1 is increased. Therefore, strain generated in the heat spreader 101 around the semiconductor chip 106 due to the heating thereof is hardly leaked through the heat spreader 101 around the recess 101a thereof, so that large stress is applied to the back surface of the semiconductor chip 106 and the mount material layer 107. Thus, the semiconductor chip 106 is easily peeled from the heat spreader 101, which deteriorates the reliability of the package.

Note that, if the heat spreader 101 is constructed in advance so that the center portion is thin to decrease the rigidity thereof and the peripheral portion is thick, to increase the rigidity thereof, the above-mentioned disadvantages are dissolved. However, in this case, the manufacturing steps become complex, which increases the manufacturing cost.

Figure 2:
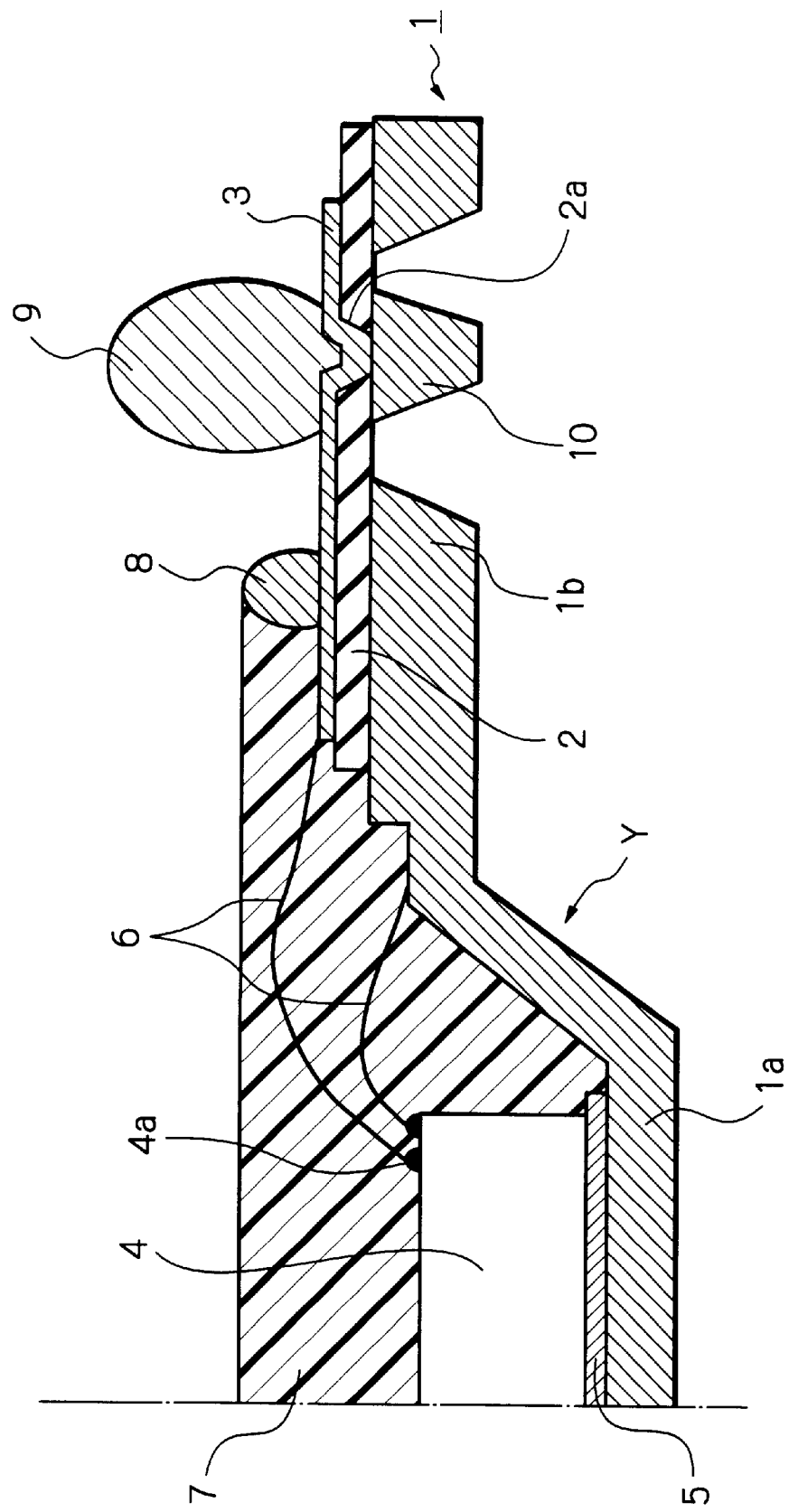
FIG. 2 is a cross-sectional view illustrating a first embodiment of the package according to the present invention.

In FIG. 2, which illustrates a first embodiment of the package according to the present invention, a heat spreader 1 made of copper or aluminum has a thin recess portion 1a and a thick plane portion 1b. Note that the heat spreader 1 also serves as a ground plane layer.

An organic insulating pattern layer 2 made of polyimide is formed on the plane portion 1b of the heat spreader 1, and a metal pattern layer 3 made of copper foil is formed on the organic insulating pattern layer 2.

On the other hand, a semiconductor chip 4 is mounted on the recess portion 1a of the heat spreader 1 by a mount material layer 6 made of Ag paste.

Electrodes 4a of the semiconductor chip 4, the heat spreader 1 and the metal pattern layer 3 are electrically connected by bonding wire 6 made of Au.

The semiconductor chip 4 is sealed by a thermosetting resin layer 7. In this case, a dam 8 is provided to prevent the thermosetting resin layer 7 from being leaked into the plane portion 1b of the heat spreader 1.

Solder balls 9 as external electrodes are formed on the metal pattern layer 3. In this case, each of the solder balls 9 is connected via the metal pattern layer 3 at throughholes 2a of the organic insulating pattern layer 2 to land patterns 10. Note that the land patterns 10 are formed by etching the heat spreader 1.

Figure 3:
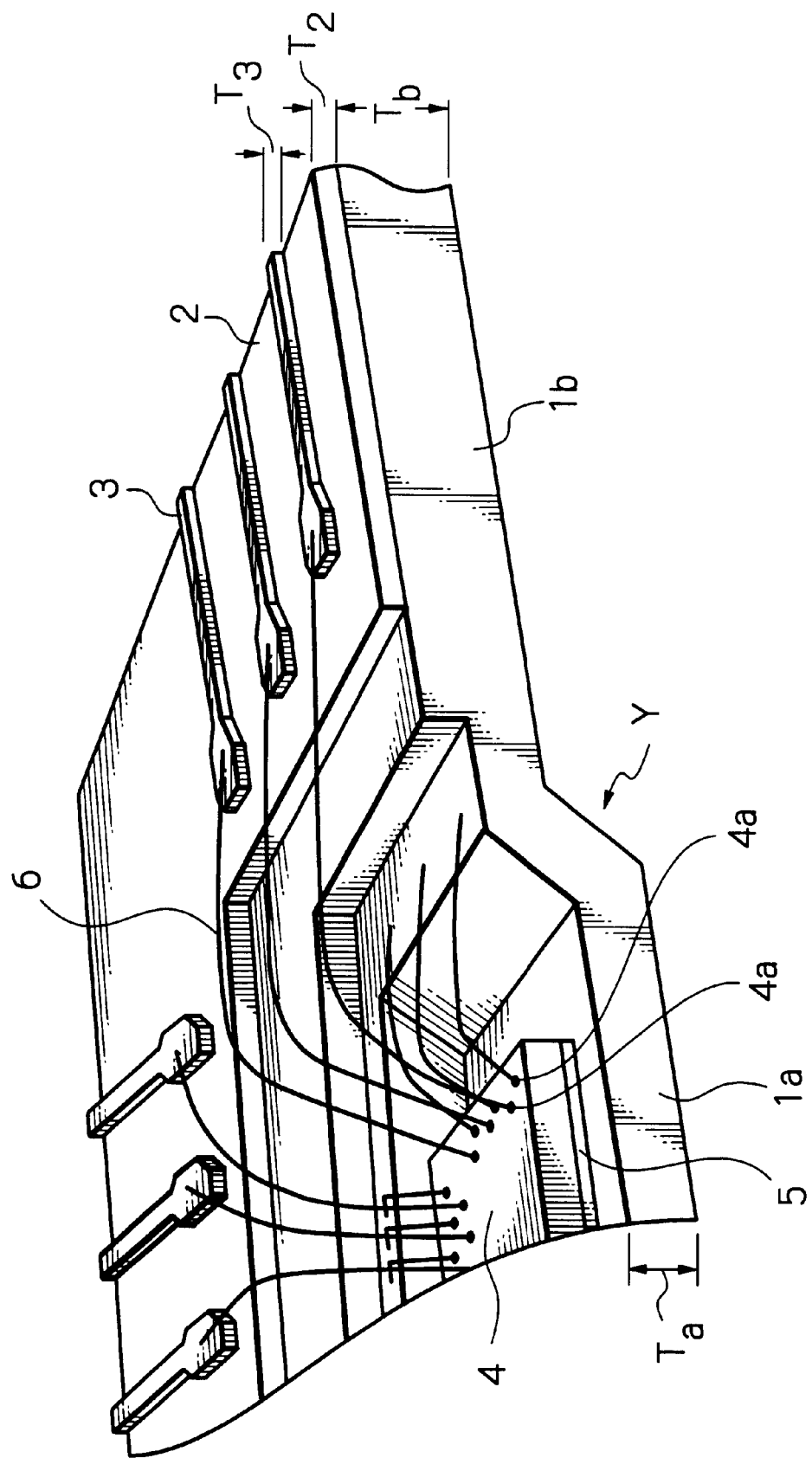
FIG. 3 is a partial perspective view of the package of FIG. 2.

In FIG. 3, which is a partial perspective view of the package of FIG. 2, the recess portion 1a of the heat spreader 1 has a thickness $T_a$ and the plane portion 1b of the heat spreader 1 has a thickness $T_b$ ($>T_a$). For example, $T_b$=0.20~0.50 mm (preferably, about 0.20mm)

$T_a$=$T_b$−about 20 to 50 µm

Also, the organic insulating pattern layer 2 has a thickness of $T_2$ of about 25 to 60 µm, preferably about 50 µm.

Further, the metal pattern layer 3 has a thickness $T_3$ of about 18 to 35 µm, preferably about 20 µm.

In the package of FIGS. 2 and 3, since the recess portion 1a is formed in the heat spreader 1 by an etching process as will be explained later, it is possible to remarkably increase the thickness of the heat spreader 1. As a result, the rigidity of the plane portion 1b of the heat spreader 1 can be sufficiently increased. This is advantageous in terms of the handling of the package and forming the solder balls 9. Simultaneously, the rigidity of the heat spreader 1 around the recess portion 1a thereof as indicated by Y in FIGS. 2 and 3 can be decreased. Therefore, strain generated in the heat spreader 1 around the semiconductor chip 4 due to the heating thereof is easily leaked through the heat spreader 1 around the recess portion 1a thereof, so that large stress is hardly applied to the back surface of the semiconductor chip 4 and the mount material layer 5. Thus, the semiconductor chip 4 is hardly peeled from the heat spreader 1, which improves the reliability of the package.

The method for manufacturing the package of FIGS. 2 and 3 will be explained with reference to FIGS. 4A through 4H.

Figure 4A:
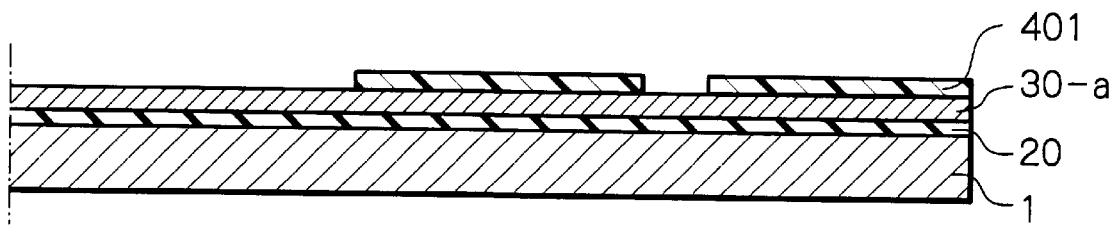
FIGS. 4A through 4H are cross-sectional views for explaining the method for manufacturing the package of FIGS. 2 and 3.

First, referring to FIG. 4A, an about 50 µm thick organic insulating layer 20 made of polyimide is coated on an about 0.2 mm thick metal plate (heat spreader) 1 of copper or aluminum. Then, a metal layer 30-a made of copper is deposited on the organic insulating layer 20. Then, a photoresist pattern layer 401 is formed by a photolithography process.

Figure 4B:
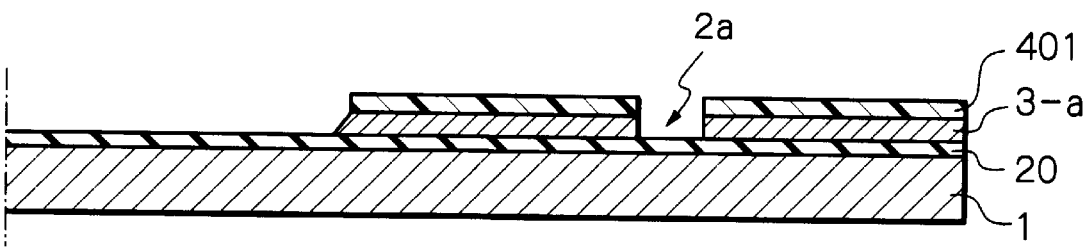

Next, referring to FIG. 4B, the metal layer 30-a is etched by using the photoresist pattern layer 401 as a mask, to form a metal pattern layer 3-a. In this case, a through hole 2a having a diameter of about 0.1 mm is perforated in the metal pattern layer 3-a. Then, the photoresist pattern layer 401 is removed.

Figure 4C:
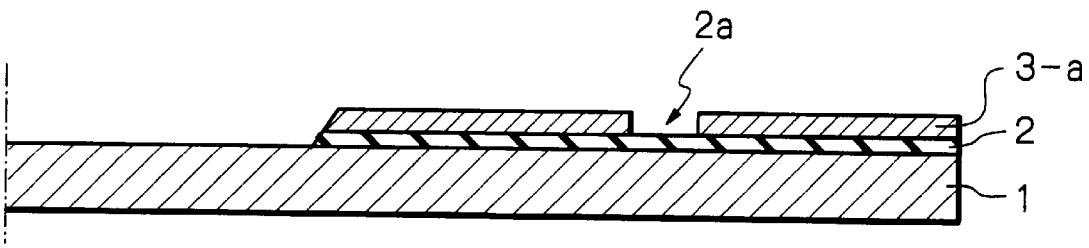

Next, referring to FIG. 4C, the organic insulating layer 20 is etched by using the metal pattern layer 3-a as a mask, to form an organic insulating pattern layer 2. Note that the through hole 2a is further deepened.

Figure 4D:
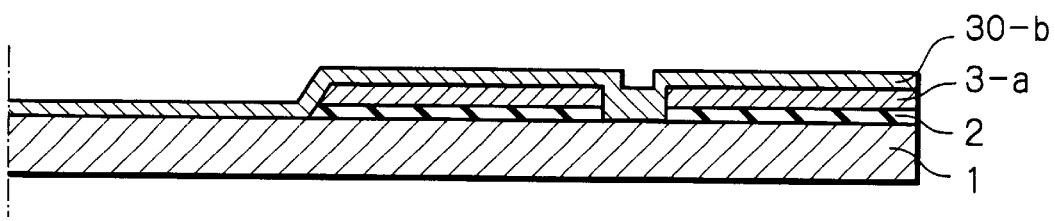

Next, referring to FIG. 4D, an about 25 µm thick metal layer 30-b made of copper is plated on the entire-surface.

Figure 4E:
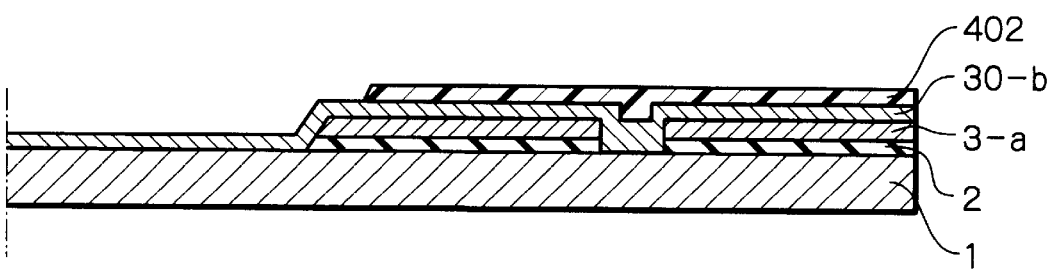

Next, referring to FIG. 4E, a photoresist pattern layer 402 for covering a plane portion of the metal plate 1 is formed by a photolithography process.

Figure 4F:
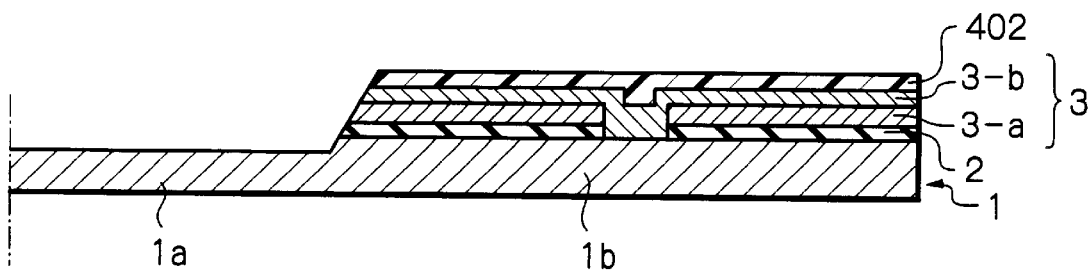

Next, referring to FIG. 4F, the metal layer 30-b is etched by using the photoresist pattern layer 402 as a mask, to form a metal pattern layer 3-b. The metal pattern layers 3-a and 3-b form a metal pattern layer 3. In this case, the metal plate 1 is also etched, so that the metal plate 1 is divided into a thin portion, i.e., a recess portion 1a and a thick portion, i.e., a plane portion 1b. Then, the photoresist pattern layer 402 is removed.

Figure 4G:
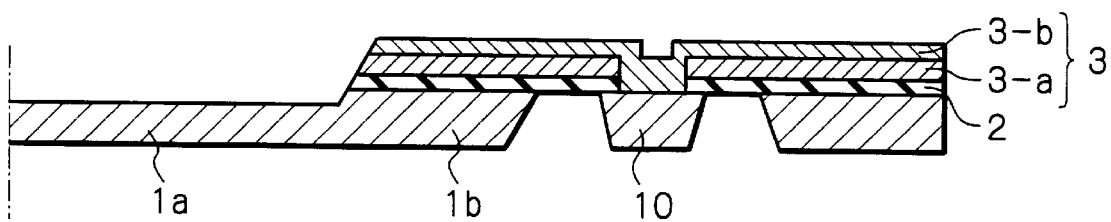

Next, referring to FIG. 4G, the plane portion 1b of the metal plate 1 is etched to form a landpattern 10.

Figure 4H:
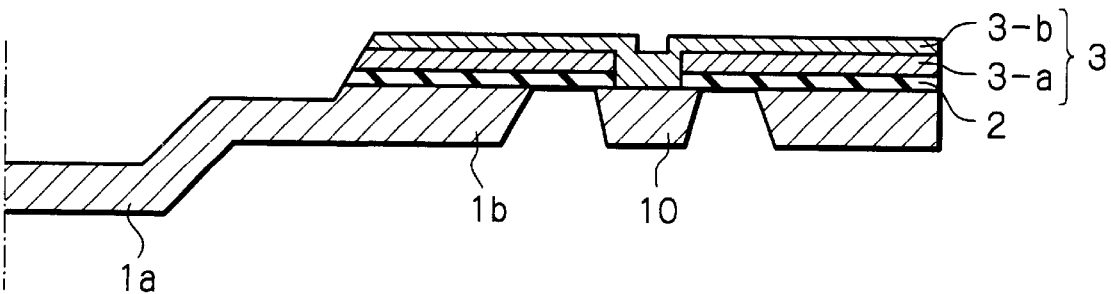

Next, referring to FIG. 4H, a pressing process using metal molds is performed upon the recess portion 1a of the metal plate 1, to form a recess therein.

Finally, a semiconductor chip (not shown) is mounted on the recess portion 1a of the heat spreader 1 by a mount material layer (not shown) made of Ag paste. Then, electrodes of the semiconductor chip, the metal plate 1 and the metal pattern layer 3 are electrically connected by bonding wire (not shown) made of Au. Then the semiconductor chip is sealed by a thermosetting resin layer (not shown). Also, solder balls (not shown) as external electrodes are formed on the metal pattern layer 3. In this case, each of the solder balls 9 is connected via the metal pattern layer 3 at through holes 2a of the organic insulating pattern layer 2 to the land patterns 10. Thus, the package of FIGS. 2 and 3 is completed.

In the method as illustrated in FIGS. 4A through 4H, since the process of etching the metal plate 1 for the recess portion 1a thereof is carried out simultaneously with the process of etching the metal layer 30-b for the metal pattern layer 3, the manufacturing steps can be simplified, which decreases the manufacturing cost. In addition, since the TAB process and the process using the adhesive layers 103 and 105 as in the prior art package of FIG. 1 are unnecessary, the manufacturing steps can be further simplified, which also decreases the manufacturing cost.

Figure 5:
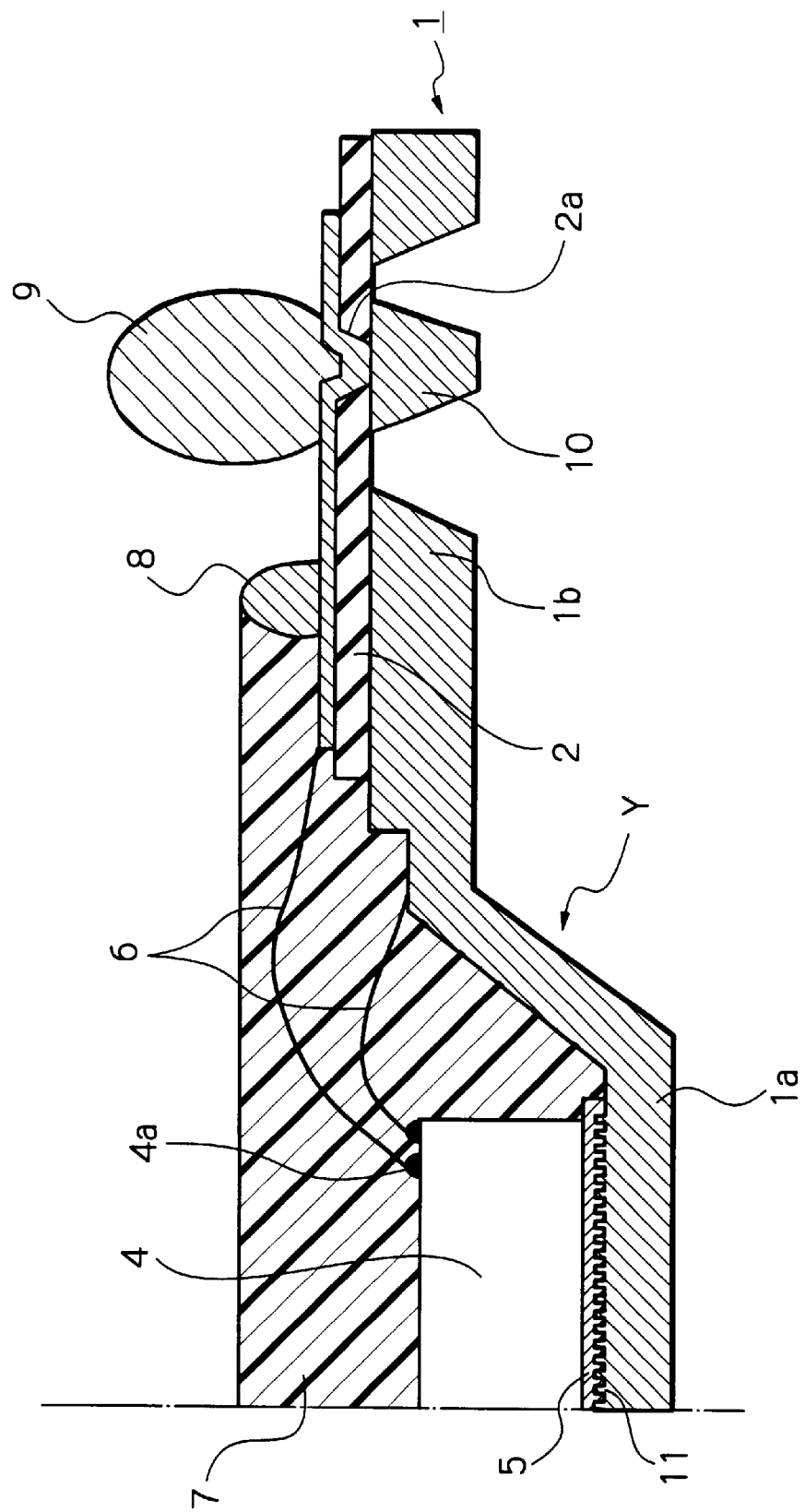
FIG. 5 is a cross-sectional view illustrating a second embodiment of the package according to the present invention.

In FIG. 5, which illustrates a second embodiment of the package according to the present invention, a plurality of pedestal type protrusions 11 having a height of about 5 to 10 µm are provided on the recess portion 1a of the metal plate 1. As a result, the contact surface of the mount material layer 5 in contact with the metal plate 1 is increased, so that the tight contact characteristics of the semiconductor chip 1 to the metal plate 1 are improved, which improves the reliability of the package.

The method for manufacturing the package of FIG. 5 will be explained next with reference to FIGS. 6A through 6H.

Figure 6A:
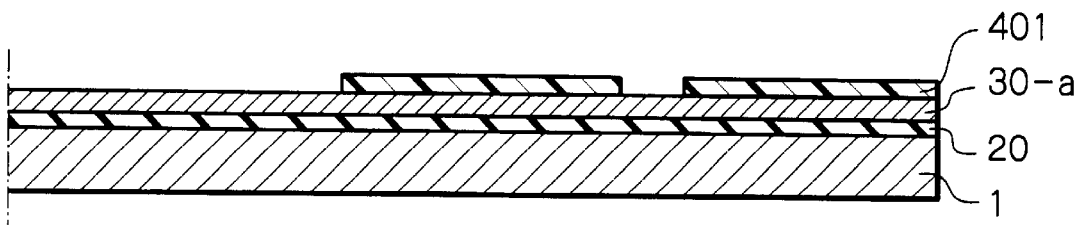
FIGS. 6A through 6H are cross-sectional views for explaining the method for manufacturing the package of FIG. 5.

First, referring to FIG. 6A, in the same way as in FIG. 4A, an about 50 µm thick organic insulating layer 20 made of polyimide is coated on an about 0.2 mm thick metal plate (heat spreader) 1 of copper or aluminum. Then, a metal layer 30-a made of copper is deposited on the organic insulating layer 20. Then, a photoresist pattern layer 401 is formed by a photolithography process.

Figure 6B:
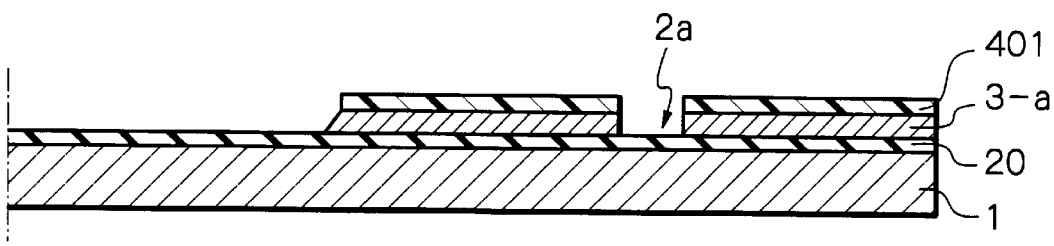

Next, referring to FIG. 6B, in the same way as in FIG. 4B, the metal layer 30-a is etched by using the photoresist pattern layer 401 as a mask, to form a metal pattern layer 3-a. In this case, a throughhole 2a having a diameter of about 0.1 mm is perforated in the metal pattern layer 3-a. Then, the photoresist pattern layer 401 is removed.

Figure 6C:
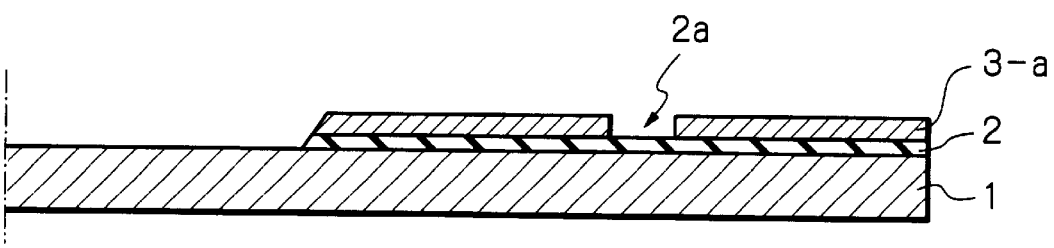

Next, referring to FIG. 6C, in the same way as in FIG. 4C, the organic insulated layer 20 is etched by using the metal pattern layer 3-a as a mask, to form an organic insulating pattern layer 2. Note that the throughhole 2a is further deepened.

Figure 6D:
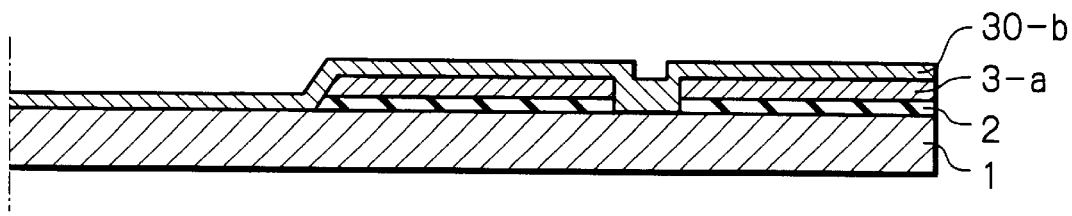

Next, referring to FIG. 6D, in the same way as in FIG. 4D, an about 25 μm thick metal layer 30-b made of copper is plated on the entire surface.

Figure 6E:
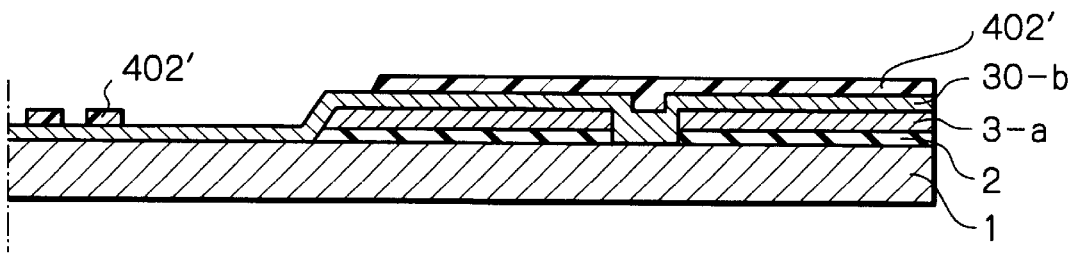

Next, referring to FIG. 6E, in a similar way to FIG. 4E, a photoresist pattern layer 402' for covering a plane portion of the metal plate 1 is formed by a photolithography process. In this case, the photoresist pattern layer 402' has a grid shape pattern including rectangles of about 50 to 100 μm in a recess portion of the metal plate 1.

Figure 6F:
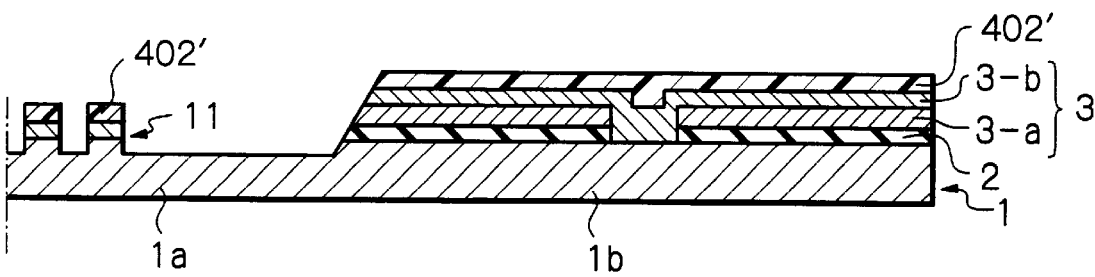

Next, referring to FIG. 6F, in the same way as in FIG. 4F, the metal layer 30-b is etched by using the photoresist pattern layer 402 as a mask, to form a metal pattern layer 3-b. The metal pattern layers 3-a and 3-b form a metal pattern layer 3. In this case, the metal plate 1 is also etched, so that the metal plate 1 is divided into a thin portion, i.e., a recess portion 1a and a thick portion, i.e., a plane portion 1b. Also, a plurality of pedestal type protrusions 11 having a height of about 5 to 10 μm are formed in the recess portion 1a. Then, the photoresist pattern layer 402' is removed.

Figure 6G:
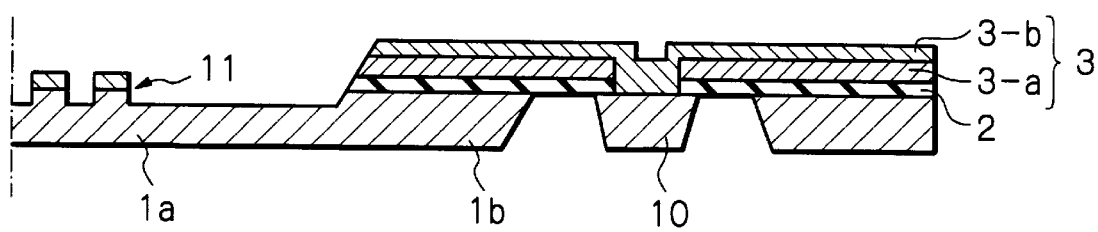

Next, referring to FIG. 6G, in the same way as in FIG. 4G, the plane portion 1b of the metal plate 1 is etched to form a landpattern 10.

Figure 6H:
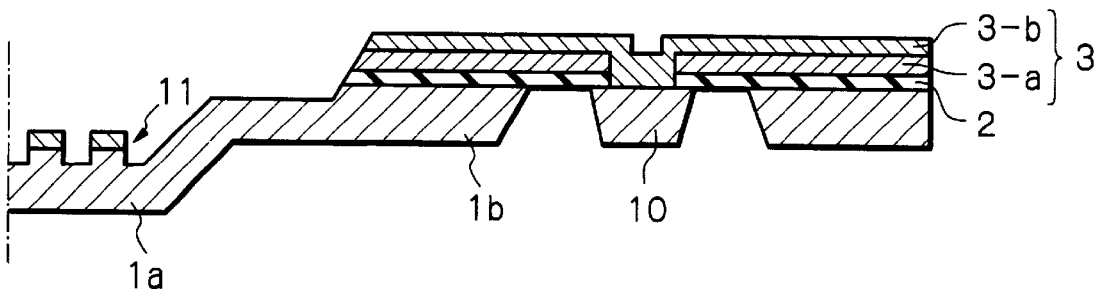

Next, referring to FIG. 6H, in the same way in FIG. 4H, a pressing process using metal molds is performed upon the recess portion 1a of the metal plate 1, to form a recess therein. In this case, one of the metal molds abutting the protrusions 11 is adjusted so that the clearance theretween is about several μm.

Finally, in the same way as in the method for the first embodiment, a semiconductor chip (not shown) is mounted on the recess portion 1a of the heat spreader 1 by a mount material layer (not shown) made of Ag paste. Then, electrodes of the semiconductor chip, the metal plate 1 and the metal pattern layer 3 are electrically connected by bonding wire (not shown) made of Au. Then the semiconductor chip is sealed by a thermosetting resin layer (not shown). Also, solder balls (not shown) as external electrodes are formed on the metal pattern layer 3. In this case, each of the solder balls 9 is connected via the metal pattern layer 3 at throughholes 2a of the organic insulating pattern layer 2 to the land patterns 10. Thus, the package of FIG. 5 is completed.

Note that when the package of FIGS. 2 and 5 is mounted on a printed circuit board, the package is faced down, so that the solder balls 9 are in contact with the printed circuit board. Also, the land patterns 10 are used for testing the electrical contact of solder balls 9 to the metal pattern layer 3.

Although the above-described embodiments relate to a BGA type package, the present invention can be applied to other types of packages.

As explained hereinabove, according to the present invention, the manufacturing steps can be simplified to decrease the manufacturing cost. In addition, the reliability can be improved.

What is claimed is:

1. A method for manufacturing a package including a metal plate including a recess portion for mounting a semiconductor chip and a plane portion for mounting a metal pattern layer, comprising the steps of:

forming a photoresist pattern layer for covering said plane portion of said metal plate including said recess portion for mounting said semiconductor chip and said plane portion for mounting said pattern layer; and etching said metal plate by using said photoresist pattern layer as a mask.

2. A method for manufacturing a package including a metal plate including a recess portion for mounting a semiconductor chip and a plane portion for mounting a metal pattern layer, comprising:

forming a photoresist pattern layer for covering said plane portion of said metal plate; and etching said metal plate by using said photoresist pattern layer as a mask, wherein said photoresist pattern layer has a plurality of patterns on said recess portion of said metal plate, so that a plurality of protrusions are formed on said recess portion of said metal plate.

3. A method for manufacturing a package for mounting including a metal plate including a recess portion for mounting a semiconductor chip and a plane potion for mounting a metal pattern layer, comprising the steps of:

forming an insulating layer on a metal plate;

forming a first metal layer on said insulating layer;

forming a first photoresist pattern layer on said first metal layer above said plane portion of said metal plate;

etching said first metal layer by using said first photoresist pattern layer as a mask;

removing said first photoresist pattern layer after said first metal layer is etched;

etching said insulating layer by using said first metal layer as a mask after said first photoresist pattern layer is removed;

forming a second metal layer on said metal plate and said first metal layer after said insulating layer is etched; and forming a second photoresist pattern layer on said second metal layer above said plane portion of said metal plate;

etching said second metal layer and said recess portion of said metal plate by using said second photoresist pattern.

4. The method as set forth in claim 3, wherein said second photoresist pattern layer has a plurality of patterns on said recess portion of said metal layer.

5. The method as set forth in claim 3, wherein said first photoresist pattern layer has a throughhole on said plane portion of said metal plate.

6. The method as set forth in claim 3, wherein said second metal layer forming step forms said second metal layer by using a plating process.

7. A method of manufacturing a package for a semiconductor chip, comprising:

providing a metal plate comprising a recess portion for mounting a semiconductor chip and a plane portion for mounting a metal pattern layer, wherein said recess portion is thinner than said plane portion;

forming a photoresist layer having a plurality of patterns on said recess portion; and etching said metal plate so that a plurality of protrusions are formed on said recess portion.

8. The method of manufacturing a package as set forth in claim 7, wherein said recess portion has a plurality of protrusions for facing said semiconductor chip.

9. A method for manufacturing a package including a metal plate including a recess portion for mounting a semiconductor chip and a plane portion for mounting a metal pattern layer, comprising:

forming a photoresist pattern layer for covering said plane portion of said metal plate including said recess portion for mounting said semiconductor chip and said plane portion for mounting said pattern layer; and etching said metal plate by using said photoresist pattern layer as a mask.

10. A method for manufacturing a package for mounting including a metal plate including a recess portion for mounting semiconductor chip and a plane portion for mounting a metal pattern layer, comprising:

forming a first metal layer on an insulating layer;

forming a first photoresist pattern layer on said first metal layer above said plane portion of said metal plate;

etching said first metal layer by using said first photoresist pattern layer as a mask;

forming a second metal layer on said metal plate and said first metal layer;

forming a second photoresist pattern layer on said second metal layer above said plane portion of said metal plate; and etching said second metal layer and said recess portion of said metal plate by using said second photoresist pattern.

11. The method as set forth in claim 10, wherein said second photoresist pattern layer has a plurality of patterns on said recess portion of said metal layer.

12. The method as set forth in claim 10, wherein a throughhole is formed said first photoresist pattern layer in on said plane portion of said metal plate.

13. The method as set forth in claim 10, wherein said second metal layer forming step forms said second metal layer by using a plating process.

14. A method for manufacturing a package, comprising:

providing a photoresist pattern layer having a plurality of patterns on a recess portion of a metal plate, so that a plurality of protrusions are formed on said recess portion of said metal plate; and etching a second metal layer and said recess portion of said metal plate by using a second photoresist pattern.

15. A method for manufacturing a package including a plate including a recess portion and a plane portion, comprising:

forming a photoresist pattern layer for covering said plane portion of said plate; and etching said plate by using said photoresist pattern layer as a mask, wherein said photoresist pattern layer has a plurality of patterns on said recess portion of said plate, so that a plurality of protrusions are formed on said recess portion of said plate.

\* \* \* \* \*